United States Patent [19]

Iwai

[11] 4,418,467

[45] Dec. 6, 1983

[54] SEMICONDUCTOR WAFER WITH ALIGNMENT MARKS AND METHOD FOR MANUFACTURING SEMICONDUCTOR DEVICE

[75] Inventor: Hiroshi Iwai, Takaidonishi, Japan

[73] Assignee: Tokyo Shibaura Denki Kabushiki Kaisha, Kawasaki, Japan

[21] Appl. No.: 390,031

[22] Filed: Jun. 18, 1982

[30] Foreign Application Priority Data

Jun. 26, 1981 [JP] Japan .................................. 56-99358

[51] Int. Cl.$^3$ ............................................ H01L 21/66
[52] U.S. Cl. ........................................ 29/574; 29/578; 148/33; 250/492.2; 356/401; 430/22
[58] Field of Search ......................... 29/574, 578, 583; 356/401; 148/1.5, 33; 250/492.2; 430/22

[56] References Cited

U.S. PATENT DOCUMENTS 4,345,836  8/1982  Phillips .............................. 355/5 3
4,376,581  3/1983  Mayer ................................. 355/77

Primary Examiner—Brian E. Hearn
Assistant Examiner—Alan E. Schiavelli
Attorney, Agent, or Firm—Finnegan, Henderson, Farabow, Garrett & Dunner

[57] ABSTRACT

A method is provided for manufacturing a semiconductor device, comprising the steps of forming alignment marks on a side surface of a semiconductor wafer, aligning the semiconductor wafer with a unit apparatus for manufacturing the semiconductor device utilizing the alignment mark, and processing the semiconductor wafer with the unit apparatus. The alignment mark attached on the side surface of the wafer can be identified even if chip patterns or various films are formed on the wafer.

12 Claims, 11 Drawing Figures

F I G. 10
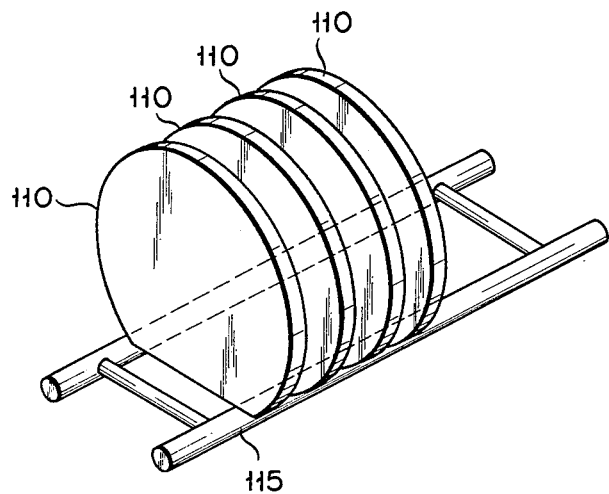
F I G. 11
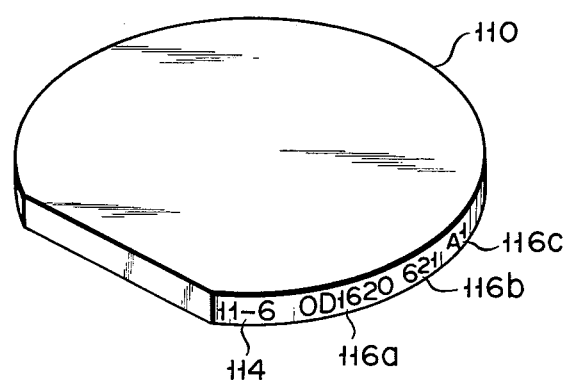

SEMICONDUCTOR WAFER WITH ALIGNMENT MARKS AND METHOD FOR MANUFACTURING SEMICONDUCTOR DEVICE

BACKGROUND OF THE INVENTION

The present invention relates to a semiconductor wafer and a method for manufacturing a semiconductor device utilizing the same.

With the recent trend for higher integration of LSIs, the technique of aligning a mask with a semiconductor wafer in the photolithography step is becoming very important. This will be described with reference to a MOS transistor of the structure shown in FIG. 1. Referring to FIG. 1, $n^+$-type source and drain regions 2 and 3 are formed in a p-type semiconductor substrate 1 as electrically insulated from each other. A gate electrode 5 is formed through a gate oxide film 4 on a channel region between the source and drain regions 2 and 3. An insulating oxide film 6 is formed over the entire surface of the structure. An aluminum wiring 8 or the like for the drain region 3 is formed through a contact hole 7 formed in the insulating oxide film 6. In a MOS transistor of this structure, alignment of the gate electrode 5 with the contact hole 7 is very important for achieving higher integration of an LSI. In other words, care must be taken so as not to cause short-circuiting between the gate electrode 5 and the drain region 3 and so as not to bring the gate electrode 5 into contact with the aluminum wiring 8 in the contact hole 7. In order to achieve this, a gap A must be guaranteed between the gate electrode 5 and the contact hole 7. In forming this gap A, a sufficient alignment margin must be allowed so as to avoid short-circuiting between the gate and source regions even though the mask for forming the contact hole 7 is misaligned with the gate electrode 5. If the alignment precision is not good, the size of gap A must be made great, thus interfering with higher integration of LSIs.

A conventional wafer alignment technique will be described with reference to a step and repeat exposure apparatus of the type shown in FIG. 2. Referring to FIG. 2, a stage 11 movable in the directions of the X- and Y-axes holds a wafer chuck 12. An optical column 13 incorporating an optical system for reducing the mask pattern in scale is arranged above the stage 11. Two alignment marks 14a and 14b as references for alignment with alignment marks 23a and 23b on a mask 22 are arranged at the upper end face of the optical column 13. A light source 15 is arranged above the optical column 13 with a predetermined distance therebetween. An alignment system 16 is attached to the side surface of the optical column 13. The alignment system 16 comprises a main body 17 which has, at its bottom, alignment marks 18a and 18b for alignment with the alignment marks of the mask, and microscopes 19a and 19b which are mounted on the main body 17 and which are used for observation of the registration state of alignment marks 25a and 25b on a wafer 24 with the alignment marks 18a and 18b. In some alignment systems of this type, a mirror or a half mirror is interposed between the alignment marks 18a and 18b and the microscopes 19a and 19b. In this case, an alignment monitor 20 may be incorporated for facilitating observation of the registration state of the alignment marks on the wafer with the alignment marks 18a and 18b. Alignment marks 21 and 21' are attached to the side surfaces of the stage 11 and the optical column 13, respectively, for alignment of these members in the direction of the Y-axis.

A method for mask alignment and exposure of a mask with a step and repeat exposure apparatus of the reduction projection type will now be described below.

A mask 22 is aligned with the optical column 13 by aligning the alignment marks 23a and 23b on the mask 22 with the alignment marks 14a and 14b attached on the upper end face of the optical column 13. During this mask alignment step, the pattern of the mask 22 is reduced in scale by the reduction projection type optical system, and the misalignment between the mask 22 and the optical column 13 is also reduced in scale. For this reason, this misalignment becomes almost negligible. After the wafer 24 is placed on the wafer chuck 12, the alignment marks 25a and 25b on the wafer 24 are aligned with the alignment marks 18a and 18b on the main body 17 by moving the wafer 24 while observing through the microscopes 19a and 19b of the alignment system 16 or while monitoring the alignment monitor 20. Upon completing alignment of the alignment marks 18a and 18b of the alignment system 16 with the alignment marks 25a and 25b of the wafer 24, the wafer 24 is aligned relative to the optical column 13 and the mask 22. This is because the alignment system 16 is fixed in position relative to the optical column 13. After alignment of the mask 22 with the wafer 24, the stage 11 is moved on rails (not shown) in the Y-axis direction to locate the wafer 24 immediately below the optical column 13 as indicated by dotted lines in FIG. 2. Alignment of the stage 11 with the optical column 13 in the Y-axis direction is automatically performed with a laser interferometer utilizing the alignment marks 21 and 21' on the stage 11 and on the optical column 13. The wafer 24 is moved around in a preprogrammed step and repeat format in the X- and Y-axis directions together with the stage 11. In each step, the mask 22 is exposed to light emitted from the light source 15. The light carrying the information on the mask pattern is supplied to the optical column 13 to be reduced thereby in scale. In this manner, the reduced mask patterns are repeatedly formed on predetermined regions 26 on the wafer 24 as shown in FIG. 3. After completing exposure of the mask 22 to light, the stage 11 is returned to the original position (where it was aligned with the wafer 24), and is replaced with a new wafer.

However, the exposure method described above presents the problems to be described below with reference to alignment of the wafer 24 with the alignment system 16.

In order to obtain satisfactory alignment precision, the alignment marks 25a and 25b of the wafer 24 of very small sizes cannot be used and must have the sizes of about 130 $\mu$m $\times$ 130 $\mu$m. Furthermore, the alignment marks 25a and 25b are generally attached at the center of the wafer 24 with a predetermined gap B therebetween. Then, this portion of the wafer 24 cannot be supplied for production of chip patterns, so that the yield of LSIs from wafers is reduced. This is because superposition of the chip pattern on the alignment marks 25a and 25b results in hard identification of the alignment marks 25a and 25b and hence in a degradation in the alignment precision. This problem similarly recurs in manual and automatic mask alignment procedures.

Even if the chip pattern is not formed on the alignment marks 25a and 25b of the wafer 24, when the alignment mark 25 is formed by etching of an oxide film 27 on the wafer 24, and various films 28 and 29 (especially the film 29 of a material which is easy to melt) are deposited on the oxide film 27 as shown in FIG. 4, the steps of the alignment mark 25 is eliminated and detection of this alignment mark 25 is thus impaired. In order to avoid this problem, the films 28 and 29 on the alignment mark 25 must be selectively etched. This results in a complex mask alignment procedure and a low yield of semiconductor devices. It is also known to form new alignment marks with the chip pattern in the second step and thereafter. The alignment marks are formed, in this case, in alignment with the chip pattern according to one method or with wafer regions other than the chip pattern according to another method. The former method results in restriction of reduction in scale of the chip pattern or design limitations of the LSI pattern since the alignment marks are formed in alignment with each chip pattern. Although the alignment marks need not be formed within the chip according to the latter method, a separate mask is required, resulting in a complex structure of the exposure apparatus and in a complex manufacturing procedure.

The manufacturing process of LSIs is increasingly automated due to rapid advances in the LSI-related technology. Automation of the LSI manufacturing process provides various advantageous. To mention some of these advantages, the manufacturing cost is reduced due to savings in labor, manual errors are eliminated, variations in the characteristics of devices produced due to slight differences in steps introduced by manual labor are eliminated, and the manufacturing yield is improved since dust-proof devices may be produced without requiring employees to work in a clean room.

Automation of the LSI manufacturing process may be achieved by the methods to be described below. As shown in FIG. 5, an information mark 30 (11-6) is formed on the surface of the wafer 24 with a laser beam or the like. Numeral "11" in the information mark 30 designates the lot # and numeral "6" designates the wafer number. Prior to each step for manufacturing a semiconductor device, the information mark 30 on the wafer 24 is read. In accordance with the read information on the wafer 24, a computer storing a control program generates instructions to perform suitable processing in each step. However, if chip patterns or various films are formed on the information mark 30, it becomes difficult to read the information mark 30, as in the case of the mask alignment technique utilizing the alignment marks described above. Furthermore, the wafers 24 are usually stood vertically next to each other on a boat or the like. Therefore, in order to read the information mark 30 on the wafer 24 shown in FIG. 5, the wafers 24 thus stored must be individually taken out of the boat, thus impairing the automatic reading operation.

SUMMARY OF THE INVENTION

It is an object of the present invention to provide a semiconductor wafer and a method for manufacturing a semiconductor device utilizing the same, wherein detection of alignment marks formed on the semiconductor wafer and reading of an information mark formed on the semiconductor wafer may be performed, during alignment of the wafer with an apparatus for manufacturing the semiconductor device or during identification of the wafer, in such a manner that the detection or reading accuracy may not be adversely affected by chip patterns or various types of films formed on the semiconductor wafer.

According to an aspect of the present invention, there is provided a method for manufacturing a semiconductor device, comprising the steps of: forming alignment marks on a side surface of a semiconductor wafer, aligning said semiconductor wafer with a unit apparatus for manufacturing said semiconductor device utilizing said alignment marks, and processing said semiconductor wafer with said unit apparatus.

According to another aspect of the present invention, there is also provided a method for manufacturing a semiconductor device, comprising the steps of: forming alignment marks on a side surface of a semiconductor wafer, aligning said semiconductor wafer with a probe of an apparatus for determining properties thereof utilizing said alignment marks, and determining the properties of said semiconductor wafer with said apparatus.

According to still another aspect of the present invention, there is also provided a semiconductor wafer with alignment marks attached on a surface thereof for the purpose of facilitating manufacture of a semiconductor device.

BRIEF DESCRIPTION OF THE DRAWINGS

FIG. 10 is a perspective view showing the manner according to which the semiconductor wafers are stored on a boat as vertically stood next to each other; and FIG. 11 is a perspective view of a semiconductor wafer according to still another embodiment of the present invention.

DETAILED DESCRIPTION OF THE PREFERRED EMBODIMENTS

The present invention will now be described in more detail with reference to the preferred embodiments thereof.

Figure 1:
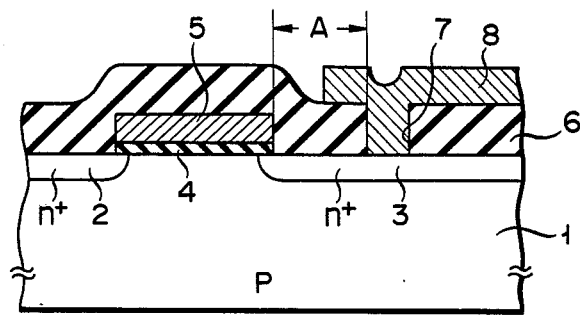
FIG. 1 is a partial sectional view of a MOS transistor for explaining a prior art mask alignment technique.
Figure 2:
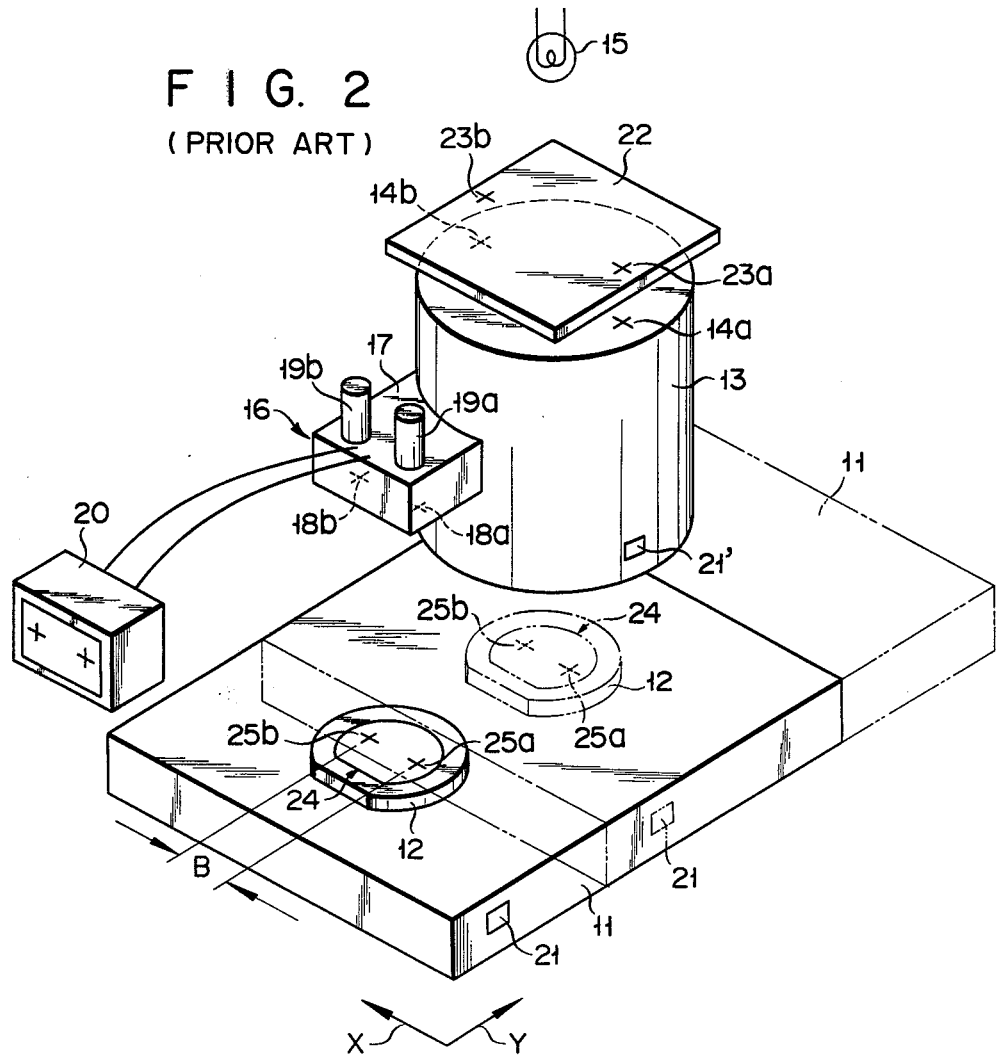
FIG. 2 is a schematic perspective view of a step and repeat exposure apparatus of the reduction projection type.
Figure 3:
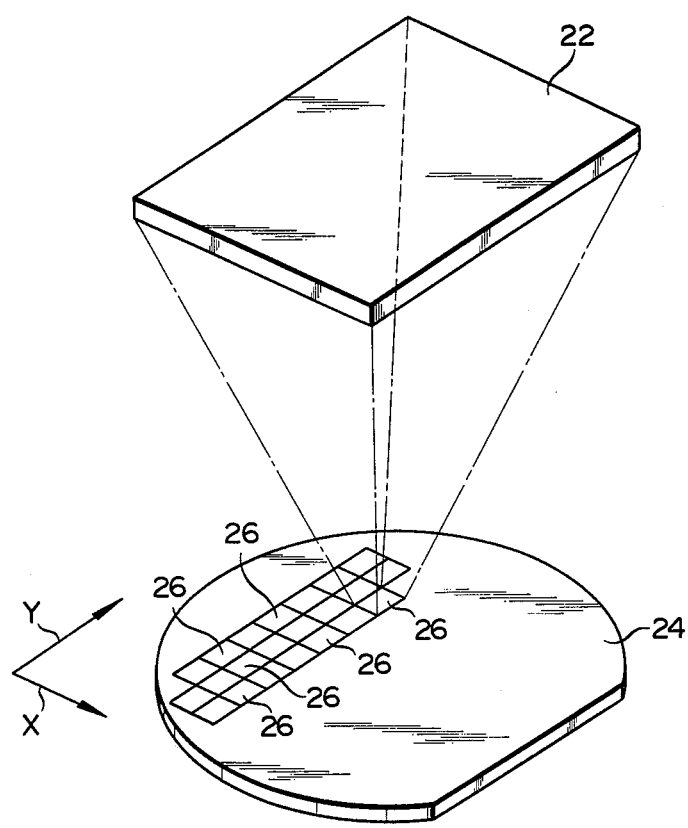
FIG. 3 is a schematic perspective view for explaining step and repeat exposure of a wafer with the exposure apparatus shown in FIG. 2.
Figure 4:
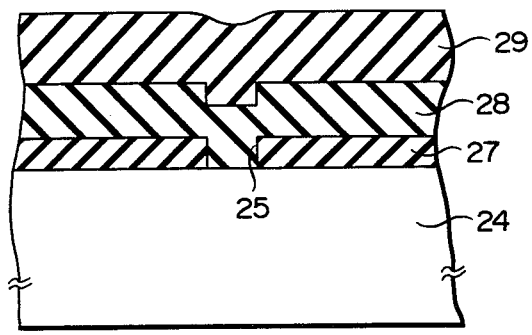
FIG. 4 is a partial sectional view showing the vicinity of an alignment mark formed on a conventional semiconductor wafer.
Figure 5:
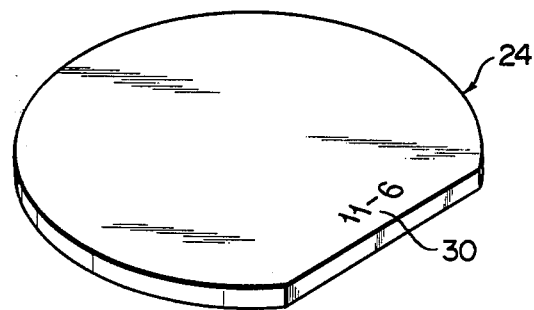
FIG. 5 is a perspective view showing a conventional semiconductor wafer with an information mark.
Figure 6:
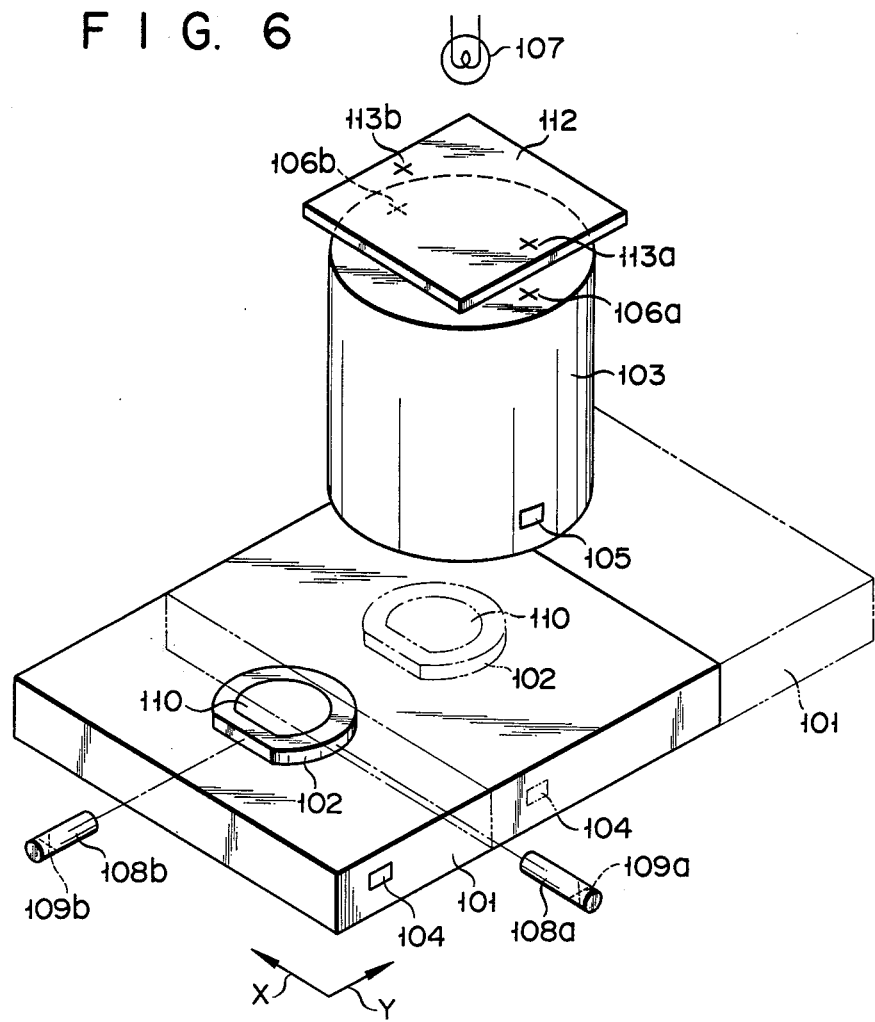
FIG. 6 is a schematic perspective view of a step and repeat exposure apparatus of the reduction projection type used according to an embodiment of the present invention.

FIG. 6 is a schematic perspective view showing a step and repeat exposure apparatus of the reduction projection type used in the exposure step in a method for manufacturing a semiconductor device according to an embodiment of the present invention. Referring to FIG. 6, a stage 101 is movable in the X- and Y-axis directions and holds a wafer chuck 102 which is held rotatable by a motor or the like. An optical column 103 incorporating an optical system for reducing the pattern of a mask 112 in scale is arranged above the stage 101. Alignment marks 104 and 105 as references for alignment of the stage 101 with the optical column 103 are attached on the side surfaces of the stage 101 and the optical column 103, respectively. Alignment marks 106a and 106b for alignment with alignment marks 113a and 113b on the mask are attached on the upper end face of the optical column 103. A light source 107 is arranged immediately above the optical column 103 with a predetermined distance therebetween. Two microscopes 108a and 108b located at predetermined positions with reference to the optical column 103 are arranged around the stage 101 such that their optical axes may cross substantially perpendicularly with each other. Alignment marks 109a and 109b for alignment with alignment marks 111a and 111b on the side surfaces of a wafer 110 are attached inside the microscopes 108a and 108b, respectively.

The exposing step with the exposure apparatus as described above will now be described.

Figure 7:
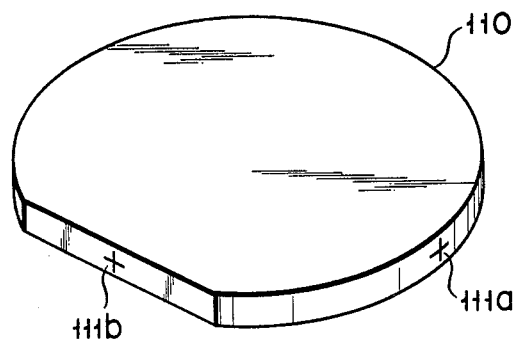
FIG. 7 is a perspective view of a semiconductor wafer according to another embodiment of the present invention.

First, as shown in FIG. 7, the alignment marks 111a and 111b are formed on the side surfaces of a wafer 110 with a laser beam at two positions which are separated substantially by a 90° angular interval. These alignment marks 111a and 111b may be formed by photolithography specifically performed for this purpose or by photolithography for formation of the field region on the wafer. If a wafer 110 of 4" diameter is used, the thickness of the wafer 110 is about 500 to 600 μm. Therefore, the sizes of these alignment marks 111a and 111b may be made sufficiently great. A wafer of a so-called beveled structure is known in which part of the side surfaces is inclined. Even with such a wafer, a sufficient vertical side surface area may be guaranteed for forming alignment marks of about 100 to 200 μm size. Of course, it is also possible to form the alignment marks on the inclined side surface portion. The greater the diameter of the wafer, the thicker the wafer, thus facilitating formation of bigger alignment marks.

The mask 112 is aligned with the optical column 103 by registering the mask 112 of a predetermined chip pattern with the alignment marks 106a and 106b on the upper end face of the optical column 103. Next, the wafer 110 as shown in FIG. 7 is placed on the wafer chuck 102. While observing through the microscopes 108a and 108b, the wafer chuck 102 and the stage 111 are moved until the alignment marks 109a and 109b in the microscopes 108a and 108b are aligned with the alignment marks 111a and 111b on the side surfaces of the wafer 110. As described above, the microscopes 108a and 108b are arranged such that their optical axes extend perpendicularly to each other. The wafer 110 can thus be two-dimensionally positioned with excellent precision. The microscopes 108a and 108b are arranged at predetermined positions with reference to the optical column 103. As a result, the wafer 110 is aligned with the optical column 103 and hence with the mask 112. Then, the stage 101 is moved on rails (not shown) in the Y-axis direction to automatically align the alignment marks 104 and 105 on the stage 101 and the optical column 103, respectively, with each other with a laser interferometer, so that the wafer 110 is positioned immediately below the optical column 103 as indicated by dotted lines in FIG. 6. Subsequently, the wafer 110 is moved in a preprogrammed step and repeat format in the X- and Y-axis directions by moving the stage 101. In each step, the mask 112 is radiated with light from the light source 107. The light containing the pattern information of the mask 112 is supplied to the optical column 103 to be reduced thereby in scale. A reduced image of the mask 112 is then formed as a chip pattern on a predetermined region of the wafer 110. After completion of the exposure step, the stage 101 is returned to the original position (the position at which the wafer 110 is aligned) and is replaced with a new wafer.

In the exposure step as described above, the wafer 110 is positioned utilizing the two alignment marks 111a and 111b formed on the side surfaces of the wafer 110. For this reason, even if the chip patterns or various films are formed over the entire surface of the wafer 110, the positions of the alignment marks 111a and 111b may be detected with excellent precision, resulting in high-precision wafer alignment and chip manufacture. This advantage is further facilitated since the number of chips to be formed on the wafer 110 need not be reduced and the alignment marks 111a and 111b of sufficient size are formed on the wafer 110. Accordingly, the dead space on the conventional wafer is eliminated, and the step for removing the films formed on the wafer for mark detection may be eliminated. Semiconductor devices may thus be manufactured by mass production at low cost and with good yield.

In the embodiment described above, exposure (photolithography) is performed with the step and repeat exposure apparatus of the reduction projection type. However, the method of the present invention can be similarly applied to photolithography steps with exposure apparatuses of other types.

The alignment technique of the wafer with the mask according to the method of the present invention is not limited to the photolithography step as described above but may be similarly applied to trimming, marking or patterning with a laser, alignment with a probe guard for determining the properties of the wafer, dicing of the wafer and so on.

The marks formed on the side surface of the wafer need not be used exclusively for alignment but may be utilized as wafer identification information so as to facilitate automatic manufacture of a semiconductor device from the wafer as will be described below.

Figure 9:
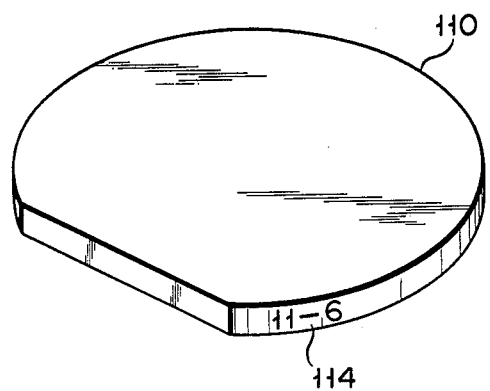
FIG. 9 is a perspective view of a semiconductor wafer according to still another embodiment of the present invention.
Figure 8:
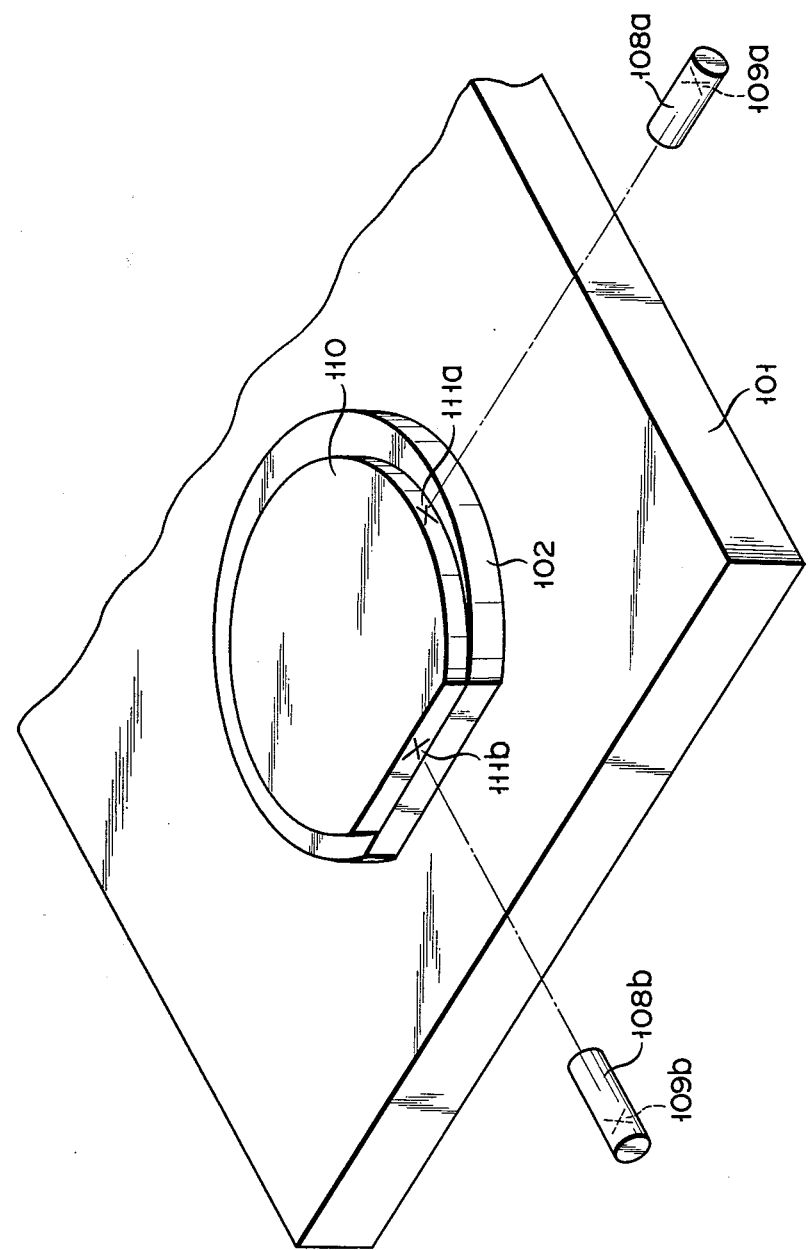
FIG. 8 is a partial perspective view showing the alignment step of the wafer.

As shown in FIG. 9, an information mark 114 (11-6) is formed on the side surface of the wafer 110. As described hereinabove, numeral 11 designates the lot #, while numeral 6 designates the wafer number. Since the thickness of the wafer 110 is sufficient, an information mark 114 of sufficient size may be formed. Prior to each step of a method for manufacturing a semiconductor device, the information mark 114 on the wafer 110 is read. A computer storing a control program controls the processing procedure in each step according to the read information mark 114.

Since the information mark 114 is formed on the side surface of the wafer 110, it may be readily read even if the chip patterns or various films are formed on the entire surface of the wafer 110. For this reason, the correct instruction for each step may be supplied from the computer in accordance with the read information mark 114.

In some steps for processing the wafer 110, the wafers 110 may be stood on a boat 115, as shown in FIG. 15, and a particular wafer 110 is removed from the boat 115 to be supplied to the next step. If the information marks are formed on the side surfaces of the wafers 110, they may be read with wafers stood on the boat without requiring removal of individual wafers. This facilitates automation of the step for manufacturing a semiconductor device.

In the wafer 110 shown in FIG. 9, the information mark 114 (11-6) includes information on the lot # and the wafer number. However, the present invention is not limited to this. For example, an information mark representing a step instruction may also be added. For example, marks 116a, 116b and 116c (OD1620, 621, A1) may be formed in addition to the information mark 114 on the side surface of the wafer 110. In this case, the mark 116a (OD1620) represents formation of an oxide film to a thickness of 620 Å in a dry atmosphere at 1,000° C. The mark 116b (621) is a space for writing, with a laser beam or the like, information on the actual thickness of the oxide film formed after oxidation. The mark 116c (A1) represents a photolithography step using a mask of A1.

The information mark to be formed on the wafer is not limited to letters or numerals described above but may be other characters such as hiraganas, katakanas, and Greek letters, or symbols such as bar patterns.

In summary, the present invention provides a semiconductor wafer and a method for manufacturing a semiconductor device using the same with high precision by mass production, wherein detection of alignment marks or reading of an information mark may be performed with high precision, regardless of presence of chip patterns or various films formed on the wafer, during alignment of the wafer with the device or identification of the properties of the wafer.

What is claimed is:

1. A method for manufacturing a semiconductor device, comprising the steps of: forming a numeral, letter, symbol or combination thereof as alignment marks on a side surface of a semiconductor wafer, aligning said semiconductor wafer with a unit apparatus for manufacturing said semiconductor device by utilizing said alignment marks, and processing said semiconductor wafer with said unit apparatus.

2. A method according to claim 1, wherein said unit apparatus comprises an exposure apparatus, and said step for processing said semiconductor wafer comprises a photolithography step.

3. A method according to claim 1, wherein said unit apparatus comprises an energy beam irradiating apparatus, and said step for processing said semiconductor wafer comprises an energy beam irradiation step.

4. A method according to claim 1, wherein said unit apparatus comprises an ion-implanting apparatus, and said step for processing said semiconductor wafer comprises an ion-implantation step.

5. A method according to claim 1, wherein said unit apparatus comprises a dicing apparatus, and said step for processing said semiconductor wafer comprises a dicing step.

6. A method for manufacturing a semiconductor device, comprising the steps of: forming a numeral, letter, symbol or combination thereof as alignment marks on a side surface of a semiconductor wafer, aligning said semiconductor wafer with a probe of an apparatus for determining properties thereof by utilizing said alignment marks, and determining the properties of said semiconductor wafer with said apparatus.

7. A method for manufacturing a semiconductor device, comprising the steps of: forming a numeral, letter, symbol or combination thereof as an information mark on a side surface of a semiconductor wafer, automatically reading said information mark, and processing said semiconductor wafer in accordance with read information of said information mark.

8. A semiconductor wafer with a numeral, letter, symbol or combination thereof as a mark formed on a side surface thereof for manufacturing a semiconductor device therefrom.

9. A semiconductor wafer according to claim 8, wherein said mark comprises alignment marks utilized for alignment of said semiconductor wafer with a unit apparatus for manufacturing a semiconductor device.

10. A semiconductor wafer according to claim 8, wherein said mark comprises alignment marks utilized for alignment of said semiconductor wafer with a probe for an apparatus for determining properties of said semiconductor wafer.

11. A semiconductor wafer according to claim 8, wherein said mark is an information mark according to which said semiconductor wafer is processed.

12. A method for manufacturing a semiconductor device, comprising the steps of: forming at least two numerals, letters, symbols or combination thereof as a pair of alignment marks on a side surface of a semiconductor wafer;

placing the semiconductor wafer on a wafer chuck which is part of a unit apparatus for manufacturing a semiconductor device, that unit apparatus including an optical column and a pair of microscopes placed at predetermined positions relative to the optical column;

observing the chip through the microscopes and moving the wafer chuck until the alignment marks on the semiconductor wafer are aligned with the microscopes;

moving the aligned wafer directly below the optical column; and forming a chip pattern on the semiconductor wafer with the optical column.

* * * * *